(12) United States Patent  
Maeda

(10) Patent No.: US 9,960,313 B2  
(45) Date of Patent: May 1, 2018

(54) SOLAR BATTERY MODULE AND MANUFACTURING METHOD THEREFOR

(71) Applicant: Panasonic Intellectual Property Management Co., Ltd., Osaka (JP)

(72) Inventor: Masanori Maeda, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days. days.

(21) Appl. No.: 15/603,452

(22) Filed: May 24, 2017

(65) Prior Publication Data

US 2017/0263800 A1    Sep. 14, 2017

Related U.S. Application Data

(63) Continuation of application No. 13/951,750, filed on Jul. 26, 2013, now Pat. No. 9,698,298, which is a (Continued)

(30) Foreign Application Priority Data

Jan. 31, 2011    (JP) .................... 2011-018720

(51) Int. Cl.
*H01L 31/048*    (2014.01)
*H01L 31/18*    (2006.01)
*B32B 17/10*    (2006.01)

(52) U.S. Cl.
CPC ........ *H01L 31/18* (2013.01); *B32B 17/10018* (2013.01); *B32B 17/10651* (2013.01); (Continued)

(58) Field of Classification Search
CPC ... H01L 31/048; H01L 31/18; H01L 31/0481; B32B 17/10018; B32B 17/10651; B32B 17/10761; B32B 17/10798
See application file for complete search history.

(56) References Cited

U.S. PATENT DOCUMENTS 5,578,142 A * 11/1996 Hattori ................. H01L 31/048  
                                            136/251  
6,660,930 B1 * 12/2003 Gonsiorawski ..... B32B 17/1033  
                                            136/244  
(Continued)

FOREIGN PATENT DOCUMENTS

WO     2011-152314 A1    12/2011

OTHER PUBLICATIONS

Office action dated Dec. 18, 2017 for a counterpart European application No. 12742022.2.

*Primary Examiner* — Devina Pillay  
(74) *Attorney, Agent, or Firm* — Metrolexis Law Group, PLLC

(57) ABSTRACT

A solar battery module and manufacturing method for a solar battery module having improved output are provided. The solar battery module 1 is a transparent substrate 10, transparent resin layer 13b, solar battery cell 12, colored resin layer 13a and back sheet 11 laminated in this order. The light-receiving surface 12a of the solar battery cell 12 faces the transparent resin layer 13b side. The backside 12b of the solar battery cell faces the colored resin layer 13a. The MFR [melt flow rate] of the transparent resin layer 13b is lower than the MFR of the colored resin layer 13a.

14 Claims, 2 Drawing Sheets

Related U.S. Application Data continuation of application No. PCT/JP2012/051149, filed on Jan. 20, 2012.

(52) U.S. Cl.
CPC .. *B32B 17/10761* (2013.01); *B32B 17/10798* (2013.01); *H01L 31/048* (2013.01); *H01L 31/0481* (2013.01); *B32B 2367/00* (2013.01); *Y02E 10/50* (2013.01)

(56) References Cited

U.S. PATENT DOCUMENTS

| | | | |
|---|---|---|---|
| 2005/0051204 A1* | 3/2005 | Oi | H01L 31/048 136/251 |
| 2006/0201544 A1* | 9/2006 | Inoue | B32B 17/10678 136/251 |
| 2010/0108125 A1* | 5/2010 | Hayes | B32B 17/10018 136/251 |
| 2013/0174907 A1 | 7/2013 | Murasawa et al. | |
| 2017/0301813 A1 | 10/2017 | Murasawa et al. | |

* cited by examiner

SOLAR BATTERY MODULE AND MANUFACTURING METHOD THEREFOR

CROSS-REFERENCE TO RELATED APPLICATIONS

This application is a continuation of application Ser. No. 13/951,750, filed on Jul. 26, 2013, which is a continuation of International Application No. PCT/JP2012/051149, filed on Jan. 20, 2012, entitled "SOLAR BATTERY MODULE AND MANUFACTURING METHOD THEREFOR", which claims priority based on Article 8 of Patent Cooperation Treaty from prior Japanese Patent Application No. 2011-018720, filed on Jan. 31, 2011, the entire contents of all of which are incorporated herein by reference.

FIELD OF THE INVENTION

The present invention relates to a solar battery module and a manufacturing method therefor.

BACKGROUND

In recent years, solar battery modules have received considerable attention as an energy source with a low environmental impact.

A solar battery module includes solar battery cells. These solar battery cells readily deteriorate when they come into contact with moisture. Because of this, solar battery cells must be isolated from outside air. Therefore, solar battery cells are usually arranged inside a filler layer provided between protective elements for protecting the front and back.

As described, for example, in Patent Document 1, this filler layer is prepared with colored EVA film in the portion positioned between the backside of the solar battery cell and the protective element on the backside. As described in Patent Document 1, the utilization efficiency of light is enhanced by the use of colored EVA film. This can improve the photovoltaic conversion efficiency.

CITED DOCUMENTS

Patent Documents

Patent Document 1: Laid-Open Patent Publication No. 2003-258283

SUMMARY

Problem Solved by the Invention

The solar battery module described in Patent Document 1 can be manufactured by arranging a solar battery cell between colored EVA film and transparent EVA film under heat and pressure to create a laminate.

However, when the solar battery module described in Patent Document 1 is manufactured using this method, some of the colored EVA flows around to the light-receiving side of the solar battery cell. When the colored EVA flows around to the light-receiving side of the solar battery cell, some of the light incident on the light-receiving surface is blocked by the colored EVA. Because this reduces the light-receiving efficiency of the light-receiving surface, the output of the solar battery module is reduced.

In view of this problem, it is an object of the present invention to provide a solar battery module and manufacturing method for a solar battery module having improved output.

Means of Solving the Problem

The solar battery module is a transparent substrate, transparent resin layer, solar battery cell, colored resin layer and back sheet laminated in this order. The light-receiving surface of the solar battery cell faces the transparent resin layer side. The backside of the solar battery cell faces the colored resin layer. The MFR [melt flow rate] of the transparent resin layer is lower than the MFR of the colored resin layer.

In the manufacturing method for a solar battery module of the present invention, a laminate of a transparent substrate, transparent resin sheet, solar battery cell, colored resin sheet and back sheet is formed in this order. The light-receiving surface of the solar battery cell faces the transparent resin sheet side. The backside of the solar battery cell faces the colored resin sheet side. The transparent resin sheet has a viscosity greater than the viscosity of the colored resin sheet. The laminate is heated during lamination.

Effect of the Invention

The present invention is able to provide a solar battery module and manufacturing method for a solar battery module having improved output.

DETAILED DESCRIPTION

Figure 1:
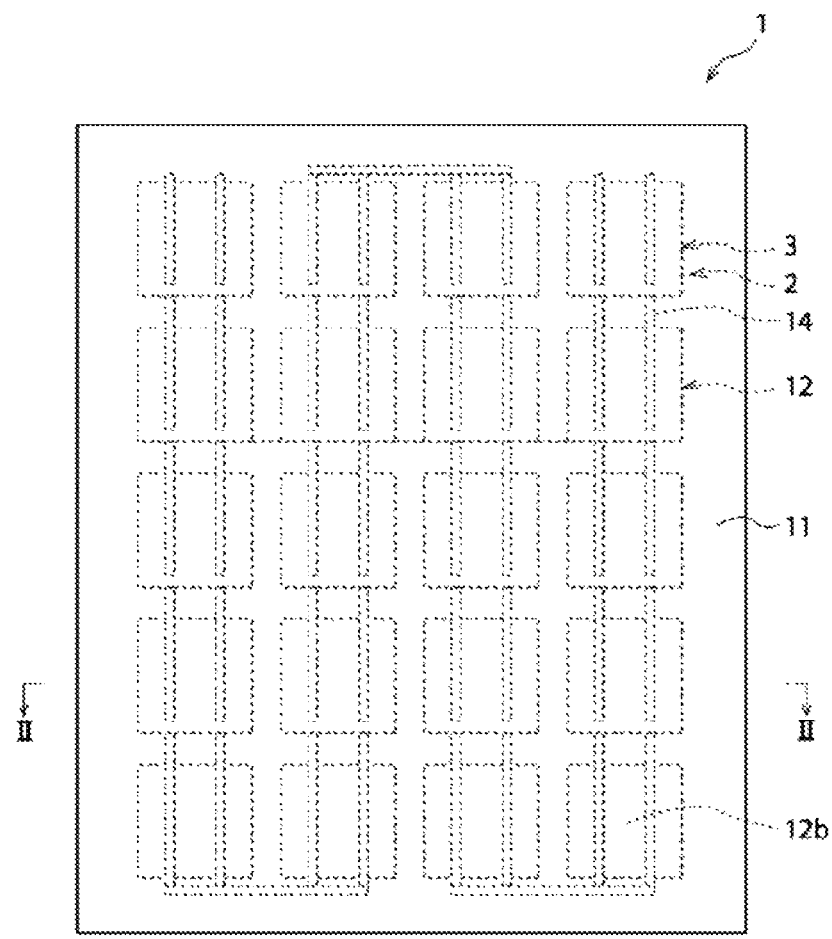
FIG. 1 is a schematic plan view of the solar cell module in an embodiment of the present invention.

The following is an explanation of preferred embodiments of the present invention. The following embodiments are merely illustrative. The present invention is not limited to these embodiments.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

Figure 2:
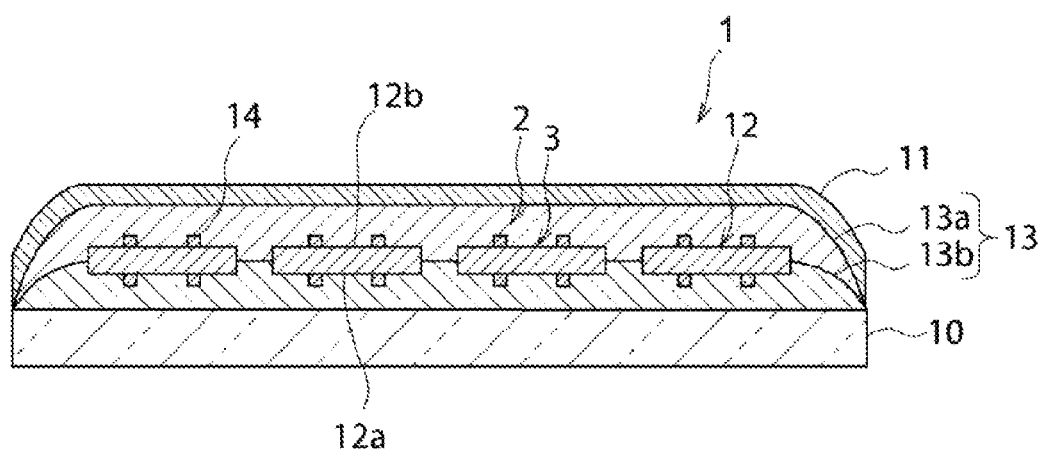
FIG. 2 is a schematic cross-sectional view from line II-II in FIG. 1.

FIG. 1 is a schematic plan view of the solar cell module in an embodiment of the present invention. FIG. 2 is a schematic cross-sectional view from line II-II in FIG. 1. As shown in FIG. 1 and FIG. 2, the solar battery module 1 includes a solar battery cell unit 2 which has a transparent substrate 10 serving as the protective element on the light-receiving side, a back sheet 11 serving as the protective element on the back side, a filler layer 13 serving as the resin layer, and more than one solar battery cell 12.

The solar battery module 1 may be surrounded by a frame. A terminal box for extracting power may also be formed above the transparent substrate 10 or back sheet 11.

(Transparent Substrate 10)

The transparent substrate 10 is arranged on the light-receiving surface 12a side of the solar battery cell 12. The transparent substrate 10 protects the solar battery cell unit 2, and provides mechanical strength to the solar battery module 1.

The transparent substrate 10 can be a glass plate or resin sheet. However, the transparent substrate 10 is preferably a glass plate. Glass plates have high rigidity and transparency to light, and are weather-resistant.

There are no particular limitations on the thickness of the transparent substrate 10. The thickness of the transparent substrate 10 may range between 3 mm and 6 mm.

(Back Sheet 11)

The back sheet 11 faces the transparent substrate 10. The back sheet 11 is arranged on the backside 12b of the solar battery cell 12. The back sheet 11 can be a flexible resin sheet such as a polyethylene terephthalate (PET) sheet. An inorganic barrier layer that is impermeable to moisture, such as aluminum foil, may be provided on the inside of the resin sheet constituting the back sheet 11. The inorganic battery layer also can be formed from an inorganic oxide such as silicon oxide, aluminum oxide, and magnesium oxide.

There are no particular limitations on the thickness of the back sheet 11. The thickness of the back sheet 11 may range between 150 μm and 300 μm.

(Solar Battery Cell Unit 2)

The solar battery cell unit 2 is arranged inside the filler layer 13. The solar battery cell unit 2 includes a plurality of solar battery cell strings 3 that are electrically connected. A solar battery cell string 3 has more than one solar battery cell 12. The solar battery cells 12 are arranged in one direction and are electrically connected in series or in parallel by wiring material 14. More specifically, the solar battery cells 12 are electrically connected in series or in parallel by electrically connecting adjacent solar battery cells 12 using wiring material 14.

Each solar battery cell 12 has a photoelectric conversion unit, and a p-side electrode and n-side electrode arranged on top of the photoelectric conversion unit. The photoelectric conversion unit generates carriers such as electrons and holes from received light. The photoelectric conversion unit may have a crystalline semiconductor substrate of one conductive type, and a p-type amorphous semiconductor layer and n-type amorphous semiconductor layer arranged on top of the crystalline semiconductor substrate. The photoelectric conversion unit may also have a semiconductor substrate with an exposed n-type dopant diffusion region and a p-type dopant diffusion region on the surface.

The photoelectric conversion unit may also have a p-type or n-type crystalline semiconductor substrate, a p-type amorphous semiconductor layer and n-type amorphous semiconductor layer formed on top of the crystalline semiconductor substrate, and an i-type amorphous semiconductor layer of a thickness contributing hardly anything at all to the generation of electricity arranged between the crystalline semiconductor and the p-type amorphous semiconductor layer and n-type amorphous semiconductor layer.

Also, the solar battery cell 12 may be a so-called back-junction solar battery cell in which both the p-side electrode and n-side electrode are arranged on the backside of the photoelectric conversion unit.

There are no restrictions on the type of material used in the p-side electrode and n-side electrode provided it is a conductive material. The p-side electrode and n-side electrode may be made of a metal such as silver, copper, aluminum, titanium, nickel or chromium, or an alloy of these metals. The p-side electrode and n-side electrode may also be a laminate with more than one metal and/or metal-alloy conductive layer.

(Filler Layer 13)

The filler layer 13 serving as the resin layer is arranged between the transparent substrate 10 and the back sheet 11. The filler layer 13 is the element used to seal the solar battery cell units 2. Therefore, the filler layer 13 may also be called a sealing layer.

The filler layer 13 is a laminate including a colored resin layer 13a and a transparent resin layer 13b formed on top of the colored resin layer 13a. The solar battery cell unit 2 is arranged at the interface between the colored resin layer 13a and the transparent resin layer 13b. The solar battery cell unit 2 is arranged so that the light-receiving surface 12a of the solar battery cell 12 is facing the transparent resin layer 13b side, and the backside 12b is facing the colored resin layer 13a side.

In the present embodiment, the filler layer 13 serving as the resin layer is a laminate of a colored resin layer 13a and a transparent resin layer 13b. However, there are no particular limitations on the resin layer of the present invention provided a colored resin layer is positioned on the backside, and a transparent resin layer is positioned on the light-receiving side and adjacent to the colored resin layer. The resin layer may have a resin layer other than a colored resin layer and a transparent resin layer. There may also be more than one colored resin layer and transparent resin layer.

The transparent resin layer 13b is arranged between the light-receiving surface 12a of the solar battery cell 12 and the transparent substrate 10. Here, the transparent resin layer 13b is a resin layer allowing passage of light in the wavelength range used by the photoelectric conversion unit in the solar battery cell 12. The transparent resin layer 13b preferably has an average transparency of 85% or greater in the 400 nm to 1,100 nm wavelength range.

The colored resin layer 13a is arranged between the backside 12b of the solar battery cell 12 and the back sheet 11. The colored resin layer 13a may be a resin composition including a resin and colorant. The colored resin layer 13a may also be made of a colored resin such as a white resin.

Specific examples of colorants include white colorants such as titanium oxide particles or calcium carbonate particles, blue colorants such as ultramarine, black colorants such as carbon black, and colorants that make the colored resin layer 13a cloudy such as glass beads and other light-scattering materials. White titanium oxide particles are preferably used as the colorant. When white titanium oxide particles are included in the colored resin layer 13a, light is readily scattered by the colored resin layer 13a, and the photoelectric conversion efficiency of the solar battery module 1 can be improved.

In the present embodiment, the melt flow rate (MFR) of the transparent resin layer 13b is lower than the MFR of the colored resin layer 13a. In other words, the resin constituting the transparent resin layer 13b and the resin constituting the colored resin layer 13a are combined so that the melt flow rate (MFR) of the transparent resin layer 13b is lower than the MFR of the colored resin layer 13a. The melt flow rate (MFR) of the transparent resin layer 13b is lower than the MFR of the colored resin layer 13a preferably by 0.7 g/10 min. or more, and more preferably by 1.0 g/10 min. or more.

More specifically, the resin constituting the transparent resin layer 13b is preferably one or more resins selected from a group including ethylenically unsaturated silane compounds, copolymers of ethylenically unsaturated silane compounds and α-olefins, and silane-modified resins.

Examples of ethylenically unsaturated silane compounds include vinyl trimethoxysilane, vinyl triethoxysilane, vinyl tripropoxysilane, and vinyl tricarboxy silane.

Examples of α-olefins include ethylene, propylene, 1-butene, isobutylene, 1-pentene, and 2-methyl-1-butene.

Examples of silane-modified resins include silane-modified ethylene, silane-modified urethane, silane-modified phenol, and silane-modified epoxies.

The resin constituting the colored resin layer 13a is preferably one or more resins selected from a group including ethylene-vinyl acetate copolymers, ethylene-ethyl acrylate copolymers, silicone resins, epoxy resins, polyvinyl butyral, ethylene vinyl alcohol copolymers, acrylic resins, polyethylene, and polypropylene.

In the present invention, the melt flow rate (MFR) is the fluidity of a molten thermoplastic resin expressed as a numerical value.

The melt flow rate (MFR) can be calculated using the following method. An extrudate is sectioned at a fixed time interval, and the weight of the series of sections is measured, and the melt flow rate (MFR) is determined using Equation (1) below.

$$\text{MFR (g/10 min.)} = 600 \times m/t \tag{1}$$

In Equation (1), MFR is the melt flow rate (g/10 min.), m is the average weight of the sections, t is the time interval (sec.) at which the same was sectioned, and 600 is the number of seconds in the reference time (=10 minutes).

(Manufacturing Method for Solar Battery Module 1)

Figure 3:
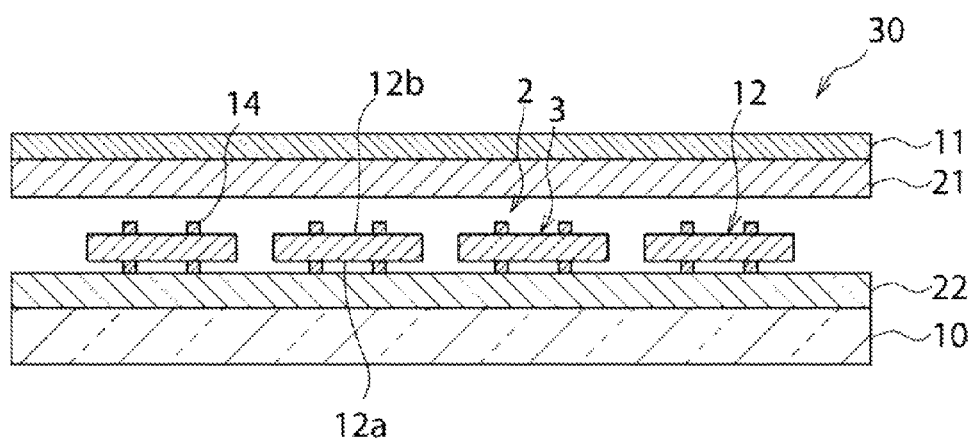
FIG. 3 is a schematic exploded cross-sectional view of the laminate.

The following is an explanation of an example of a method for manufacturing the solar battery module 1 with reference to FIG. 3.

First, as shown in FIG. 3, a laminate 30 is formed by laminating the transparent resin sheet 22 constituting the transparent resin layer 13b, the solar battery cell unit 2, the colored resin sheet 21 constituting the colored resin layer 13a, and the back sheet 11 on top of the transparent substrate 10 in this order (laminate formation step).

Next, the laminate 30 is heated to complete the solar battery module 1 (lamination step).

In the present embodiment, as mentioned above, the melt flow rate (MFR) of the transparent resin layer 13b is lower than the MFR of the colored resin layer 13a. For this reason, the colored resin sheet 21 used in the lamination process has a viscosity that is lower than that of the transparent resin sheet.

When the laminate is laminated, the transparent resin sheet and colored resin sheet become thinner at the edges of the laminate. Also, some of the transparent resin sheet and colored resin sheet at the edges of the laminate flow towards the center of the laminate during the lamination process. The transparent substrate is relatively hard, and the resin sheet is flexible. As a result, the colored resin sheet provided on the resin sheet tries to flow towards the center of the laminate and towards the transparent substrate. This allows the colored resin sheet to flow around to the light-receiving surface of the solar battery cell on the edges of the solar battery cell unit.

However, in the present embodiment, the MFR of the transparent resin layer 13b is lower than the MFR of the colored resin layer 13a. During the lamination process, the viscosity of the colored resin sheet 21 is also lower than the viscosity of the transparent resin sheet 22. Therefore, colored resin sheet 21 trying to flow around to the light-receiving surface 12a of the solar battery cell 12 is stopped by the higher viscosity transparent resin sheet 22. As a result, the colored resin sheet 21 can be effectively prevented from flowing around to the light-receiving surface 12a of the solar battery cell 12. Thus, a solar battery module 1 with improved photoelectric conversion efficiency can be manufactured.

In order to effectively prevent the resin of the colored resin sheet 21 from flowing around to the light-receiving surface 12a of the solar battery cell 12, the MFR of the transparent resin layer 13b (=the MFR of the transparent resin sheet 22) is lower than the MFR of the colored resin layer 13a (=MFR of the colored resin sheet 21) preferably by 0.7 g/10 min. or more, and more preferably by 1.0 g/10 min. or more.

KEY TO THE DRAWINGS

1: Solar Battery Module
2: Solar Battery Cell Unit
3: Solar Battery Cell String
10: Transparent Substrate
11: Back Sheet
12: Solar Battery Cell
12a: Light-Receiving Surface
12b: Backside
13: Filler Layer
13a: Colored Resin Layer
13b: Transparent Resin Layer
14: Wiring Material
21: Colored Resin Sheet
22: Transparent Resin Sheet
30: Laminate

What is claimed is:

1. A manufacturing method for a solar battery module, the method comprising:
    forming a laminate of a transparent substrate, a transparent resin sheet, a solar battery cell unit, a colored resin sheet, and a back sheet in this order a light receiving surface of the solar battery cell unit facing the transparent resin sheet; and
    heating the laminate, wherein
    a melt flow rate, MFR, of the transparent resin sheet is lower than an MFR of the colored resin sheet,
    a resin of the transparent resin sheet consists of copolymers of ethylenically unsaturated silane compounds and α-olefins, and
    a resin of the colored resin sheet consists of at least one selected from the group consisting of ethylene-vinyl acetate copolymers, ethylene-ethyl acrylate copolymers, silicone resins, epoxy resins, polyvinyl butyral, ethylene vinyl alcohol copolymers, acrylic resins, polyethylene, and polypropylene.

2. The manufacturing method for a solar battery module according to claim 1, wherein the MFR of the transparent resin sheet is lower than the MFR of the colored resin sheet by 0.7 g/10 min. or more.

3. The manufacturing method for a solar battery module according to claim 1, wherein the MFR of the transparent resin sheet is lower than the MFR of the colored resin sheet by 1.0 g/10 min. or more.

4. The manufacturing method for a solar battery module according to claim 1, wherein
    the transparent substrate is a glass plate or a resin sheet, and
    the back sheet is a resin sheet having a thickness that ranges between 150 μm and 300 μm.

5. The manufacturing method for a solar battery module according to claim 1, wherein the heating the laminate comprises:
deforming the transparent resin sheet such that a thickness of the transparent resin sheet at each of edges thereof is smaller than a thickness of the transparent resin sheet at a center portion thereof by causing the resin of the transparent resin sheet at the each of edges thereof to flow towards the center portion thereof; and
deforming the colored resin sheet such that a thickness of the colored resin sheet at each of edges thereof is smaller than a thickness of the colored resin sheet at a center portion thereof by causing the resin of the colored resin sheet at the each of edges thereof to flow towards the center portion thereof.

6. The manufacturing method for a solar battery module according to claim 1, wherein
in the forming the laminate, the solar battery cell unit comprises solar battery cell strings that are electrically connected to each other, each solar battery cell string comprising solar battery cells that are electrically connected by wiring material.

7. The manufacturing method for a solar battery module according to claim 1, wherein the colored resin sheet comprises at least one colorant selected from the group consisting of titanium oxide particles, calcium carbonate particles, ultramarine, carbon black, and light-scattering material.

8. The manufacturing method for a solar battery module according to claim 7, wherein the light-scattering material comprises glass beads.

9. A manufacturing method for a solar battery module, the method comprising:
forming a laminate of a transparent substrate, a transparent resin sheet, a solar battery cell unit, a colored resin sheet, and a back sheet in this order a light receiving surface of the solar battery cell unit facing the transparent resin sheet; and
heating the laminate, wherein
in the heating the laminate, a viscosity of the colored resin sheet is lower than a viscosity of the transparent resin sheet,
a resin of the transparent resin sheet consists of copolymers of ethylenically unsaturated silane compounds and α-olefins, and
a resin of the colored resin sheet consists of at least one selected from the group consisting of ethylene-vinyl acetate copolymers, ethylene-ethyl acrylate copolymers, silicone resins, epoxy resins, polyvinyl butyral, ethylene vinyl alcohol copolymers, acrylic resins, polyethylene, and polypropylene.

10. The manufacturing method for a solar battery module according to claim 9, wherein
the transparent substrate is a glass plate or a resin sheet, and
the back sheet is a resin sheet having a thickness that ranges between 150 μm and 300 μm.

11. The manufacturing method for a solar battery module according to claim 9, wherein
the heating the laminate comprises:
deforming the transparent resin sheet such that a thickness of the transparent resin sheet at each of edges thereof is smaller than a thickness of the transparent resin sheet at a center portion thereof by causing the resin of the transparent resin sheet at the each of edges thereof to flow towards the center portion thereof; and
deforming the colored resin sheet such that a thickness of the colored resin sheet at each of edges thereof is smaller than a thickness of the colored resin sheet at a center portion thereof by causing the resin of the colored resin sheet at the each of edges thereof to flow towards the center portion thereof.

12. The manufacturing method for a solar battery module according to claim 9, wherein
in the forming the laminate, the solar battery cell unit comprises solar battery cell strings that are electrically connected to each other, each solar battery cell string comprising solar battery cells that are electrically connected by wiring material.

13. The manufacturing method for a solar battery module according to claim 9, wherein the colored resin sheet comprises at least one colorant selected from the group consisting of titanium oxide particles, calcium carbonate particles, ultramarine, carbon black, and light-scattering material.

14. The manufacturing method for a solar battery module according to claim 13, wherein the light-scattering material comprises glass beads.

\* \* \* \* \*